United States Patent [19]

Pierce et al.

[11] Patent Number: 5,179,534
[45] Date of Patent: Jan. 12, 1993

[54] METHOD AND APPARATUS FOR SETTING DESIRED LOGIC STATE AT INTERNAL POINT OF A SELECT STORAGE ELEMENT

[75] Inventors: Kerry M. Pierce, Fremont; Thomas V. Ferry, Saratoga, both of Calif.

[73] Assignee: CrossCheck Technology, Inc., San Jose, Calif.

[21] Appl. No.: 601,969

[22] Filed: Oct. 23, 1990

[51] Int. Cl.[5] .............................................. G11C 7/00
[52] U.S. Cl. ................................. 365/189.01; 365/201
[58] Field of Search ............. 365/189.01, 201, 189.08

[56] References Cited

U.S. PATENT DOCUMENTS

| | | | |
|---|---|---|---|
| 3,761,675 | 9/1973 | Mason et al. | 214/121 L |
| 3,795,859 | 3/1974 | Benante et al. | 324/73 R |
| 3,806,891 | 4/1974 | Eichelberger et al. | 364/716 |
| 4,293,919 | 10/1981 | Dasgupta et al. | 364/716 |
| 4,513,418 | 4/1985 | Bardell, Jr. et al. | 371/25 |
| 4,517,672 | 5/1985 | Pfleiderer et al. | 371/27 |
| 4,613,970 | 9/1986 | Masuda et al. | 371/25 |
| 4,749,947 | 6/1988 | Gheewala | 324/73 R |

FOREIGN PATENT DOCUMENTS 0223714 5/1987 European Pat. Off. .

OTHER PUBLICATIONS

"Design for Testability-A Survey", by T. W. Williams, et al., *Proceedings IEEE*, vol. 71, pp. 359–416, Jan. 1983.
"A Logic Design Structure for LSI Testability", Eichelberger, et al., *Proceedings 14th Design Automation Conf.*, Jun. 1977.
"Built-in Self-Test Techniques" by E. J. McClusky, *IEEE Design and Test*, vol. 2, No. 2, pp. 21–28, Apr. 1985.
"Built-in Self-Test Structures" by E. J. McClusky, *IEEE Design and Test*, vol. 2, No. 2, pp. 29–36, Apr. 1985.
"Voltage Checking Device" by G. Canard and A. Potocki, *IBM Technical Disclosure Bulletin*, vol. 8, No. 5, Oct. 1965.

*Primary Examiner*—Joseph A. Popek
*Attorney, Agent, or Firm*—Townsend and Townsend

[57] ABSTRACT

An IC having a test grid structure including intersecting probe lines and control/sense lines is used to apply desired logic states directly to internal transmission paths of select storage elements. A switch is located at each intersection for conducting the desired logic state to the internal transmission path. To achieve overwriting and storage of the desired logic state, the conventional storage element is modified to include a transmission gate activated by an overwrite enable signal. The overwrite enable signal is defined by one or more probe lines. To overwrite the contents of a storage element, the storage element is selected by turning on the switch with a probe line coupled to such switch, while the included transmission gate is disabled by receiving the overwrite enable signal. The logic state of the control/sense line is conducted into the storage element to the included transmission gate where it overwrites the current contents and is stored.

11 Claims, 4 Drawing Sheets

METHOD AND APPARATUS FOR SETTING DESIRED LOGIC STATE AT INTERNAL POINT OF A SELECT STORAGE ELEMENT

CROSS-REFERENCE TO RELATED APPLICATION

This invention is related to commonly-assigned, co-pending U.S. patent application Ser. No. 554,313 filed Jul. 17, 1990, for METHOD AND APPARATUS FOR SETTING DESIRED SIGNAL LEVEL ON STORAGE ELEMENT, the entire content of which is incorporated herein by reference and made a part hereof.

BACKGROUND OF THE INVENTION

This invention relates to a storage element for an integrated circuit device and a method for setting desired signal levels at such storage element. More particularly, this invention relates to a modified storage element having an additional read/write input which may be controlled to allow test circuitry to define a desired signal level for the storage element.

During testing of integrated circuits (ICs), it is necessary to force specific logic states at select storage elements. Typically, this has been accomplished by using the primary input pins of the IC. As integrated circuits become more complex, it is more difficult to define the desired logic states using the primary input pins of the IC. For example, in complex ICs, the states of many logic gates and storage element output lines may not be defined readily through the primary pins because of the many circuit levels between such gates or elements and the primary input pins.

One approach for defining logic states at a storage element is commonly referred to as SCAN. See "Design For testability—A Survey" by T. W. Williams and K. P. Parker, *Proceedings IEEE*, Vol. 71, pp98–112, January 1983; and "A Logic Design Structure For LSI Testing" by E. B. Eichelberger and T. W. Williams, *Proceedings 14th Design Automation Conference*, June 1977 77CH1216-1C, pp. 462–468. Also see "Built-in Self-Test Techniques" and "Built-in Self-Test Structures" by E. J. McClusky, *IEEE Design and Test*, Vol. 2, No. 2, pp. 437–452. Also see U.S. Pat. Nos. 3,806,891 (Eichelberger et. al.); 3,761,675; 4,293,919 (Dasgupta et. al.) and 4,513,418 (Bardell, Jr. et. al.) assigned to the IBM Corporation which disclose the serial connection of flip-flops into a shift register to allow access to them through "fewer" test points.

According to the SCAN approach, the integrated circuit is designed to tie the select storage elements to one or more shift register chains. The shift registers can thereafter be loaded through test contacts or through the primary input pins during a test, enabling the desired logic states to be loaded to the select storage elements. In effect, the conventional SCAN approaches multiplex the input to the storage element so that during testing, the test circuitry generates the input signal, whereas during normal operation the normal integrated circuit logic generates the input signal.

Drawbacks of the SCAN approach are the resulting increase in surface area, the resulting increase in circuit delay times during normal operation and cumbersome design constraints. Typically an integrated circuit designed to conform to the SCAN approach suffers a 10% speed loss and 20% area loss attributable to the SCAN methodology. Accordingly, a more effective approach for setting predefined levels at select storage elements during testing is needed.

Other approaches for defining logic states or monitoring internal components of circuitry, including integrated circuits, are described in U.S. Pat. No. 4,613,970 for INTEGRATED CIRCUIT DEVICE AND METHOD OF DIAGNOSING THE SAME; EPO patent publication number 223 714 A2 for SEMICONDUCTOR INTEGRATED CIRCUIT DEVICE WITH TEST CIRCUIT; U.S. Pat. No. 4,517,672 for METHOD AND ARRANGEMENT FOR AN OPERATIONAL CHECK OF A PROGRAMMABLE LOGIC ARRAY; IBM Technical Disclosure Bulletin Vol. 8, no. 5 October 1965, "Voltage Checking Device" by G. Canard and A. Potocki; and U.S. Pat. No. 3,795,859 for METHOD AND APPARATUS FOR DETERMINING THE ELECTRICAL CHARACTERISTICS OF A MEMORY CELL HAVING FIELD EFFECT TRANSISTORS.

In commonly-assigned U.S. Pat. No. 4,749,947 of the same inventor issued Jun. 7, 1988 for GRID-BASED, "CROSS-CHECK" TEST STRUCTURE FOR TESTING INTEGRATED CIRCUITS, a functionally independent, internal grid-based structure for an integrated circuit is disclosed enabling testing of complex integrated circuits. Referring to such structure as shown in FIG. 1 herein, a grid-structure 10 on an integrated circuit 11 is formed of individually accessible probe lines 12 and sense/control lines 14 with electronic switches 16 at the crossings. A probe line 12 is coupled to a switch 16 for defining the switch "ON" or "OFF" state. One end of the switch 16 is coupled to a test point 18 of the integrated circuit 11, while the other end is coupled to a sense/control line 14 for monitoring a signal from the test point 18. Activating a select switch 16 through a corresponding probe line 12 enables monitoring or exciting a test point. The integrated circuit includes primary input pins 19, probe line contacts 20 and sense line contacts 21. The test points 18 are coupled to the input line or output line of a corresponding gate G.

The grid structure described above is used for observing signals at the test points 18. The switches 16 coupled to the test points 18 have a high impedance so as to provide less current drive than the logic gates G. As a result, the switch lines do not alter or disturb the internal signals of the integrated circuit 11 during observation.

While testing an integrated circuit, it is typical to apply test signals to the primary input pins of the IC to form a test pattern which defines specific data input signals to select internal elements of the IC (e.g., SCAN techniques). In addition, it is also known to define such data input signals through test points coupled directly (e.g., "Cross-Check" matrix) or indirectly (e.g., SCAN techniques) to the select internal elements. A method of setting desired signal levels for storage elements of an IC by forcing logic states on the select storage elements is needed. Setting the desired signal levels by forcing (e.g., overpowering) logic states otherwise occurring at the select storage elements is needed.

The commonly-assigned co-pending U.S. patent application Ser. No. 554,313, filed Jul. 17 1990, included herein by reference, describes an apparatus and method for setting desired signal levels at select storage elements. According to such application, the desired signal level may be forced at the output, input or an internal point of the storage element. According to the present invention herein, a related method and apparatus for setting a desired signal level at an internal point of a modified storage element is described.

SUMMARY OF THE INVENTION

According to the invention, in an electronics data storage device an overwrite enable signal is coupled to a control point of a storage element for enabling a desired logic state which has been received at a designated internal point of the storage element in order to overwrite the contents of the storage element.

According to one aspect of the invention, a conventional storage element is modified to provide an input path for the overwrite enable signal. The input path is defined by an additional transmission gate added to the storage element. The transmission gate has a data input, an overwrite enable signal input and a data output. The data input is coupled to a storage-element-internal point at which the desired logic state is to be received. The overwrite enable input is coupled to the overwrite enable signal for defining the on/off state of the transmission gate. The data output is coupled to another transmission gate of the storage element.

According to another aspect of the invention, a plurality of the modified storage elements are formed on an IC which includes a test grid structure of intersecting probe lines and control/sense lines. Storage elements may be programmed with desired logic levels by addressing select probe lines, activating the overwrite enable signal, and generating the desired logic states at corresponding control/sense lines. Such control/sense lines are coupled to internal points of respective storage elements for overwriting the element contents when the corresponding overwrite enable signal is active.

According to a test grid structure of probe lines and control/sense lines, a specific probe line selects a row of storage elements. Similarly, a specific control/sense line is coupled to each storage element within a column of storage elements. When the overwrite enable signal is active and a particular probe line is addressed, a test signal from the test circuitry applied along one or more control/sense lines defines the desired logic state conducted to an internal point of select storage elements. As a result, the contents of select storage elements are overwritten. When the overwrite signal returns to the inactive state, such desired logic state is maintained as the stored signal level.

According to another aspect of the invention, the state of an overwrite enable signal for a select storage element is defined by one or more probe lines. A first probe line addresses the select storage element for a test operation (e.g., overwrite or sense). A second probe line defines the state of the overwrite enable signal for such storage element when the first probe line is active. According to one embodiment such defining of the overwrite enable signal is determined as a logical NOR result of such first and second probe lines.

DESCRIPTION OF THE SPECIFIC EMBODIMENTS

Conventional Storage Element

Figure 1:
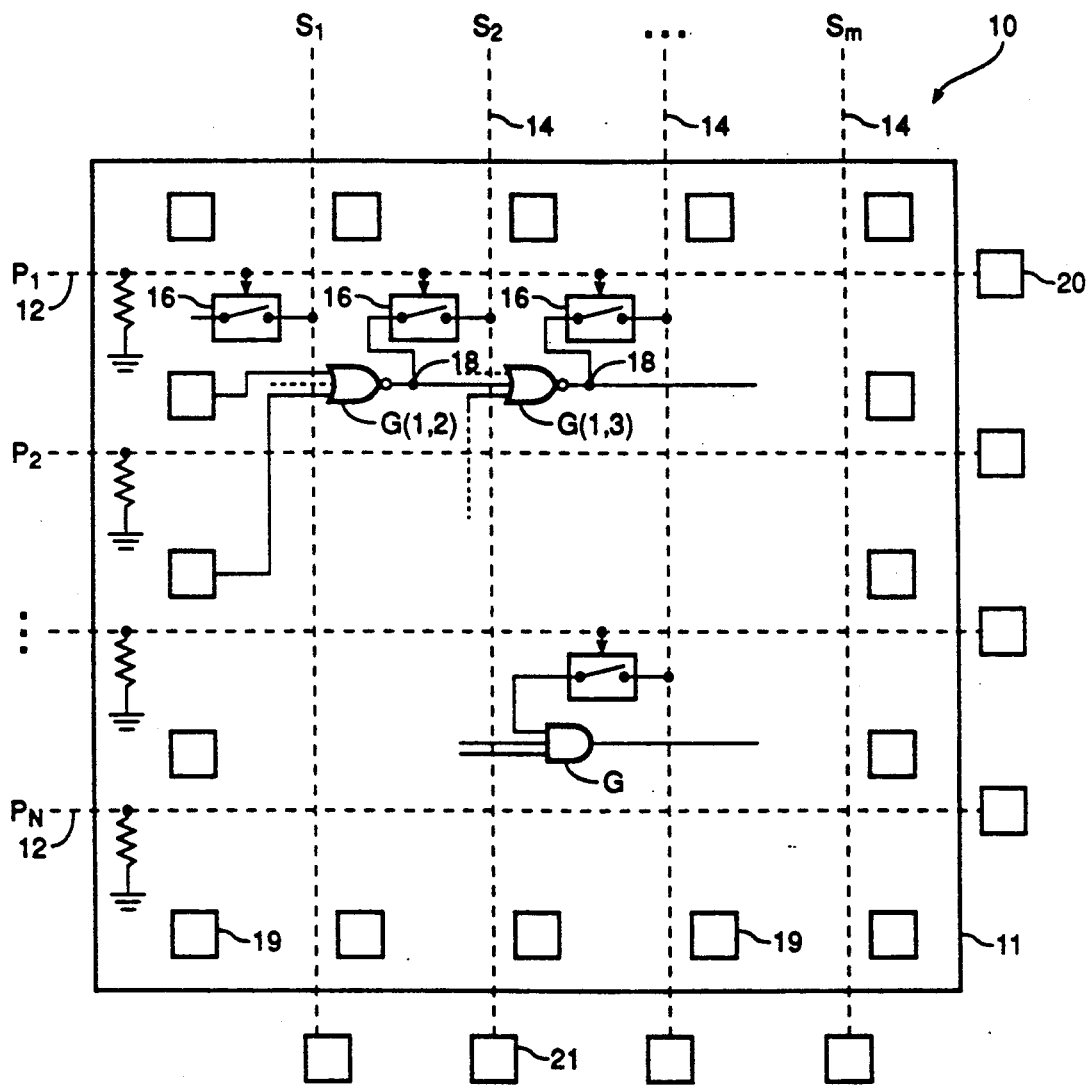
FIG. 1 is a schematic diagram of a prior art test structure on an integrated circuit showing intersecting probe lines and sense lines coupled to electronic switches.
Figure 2:
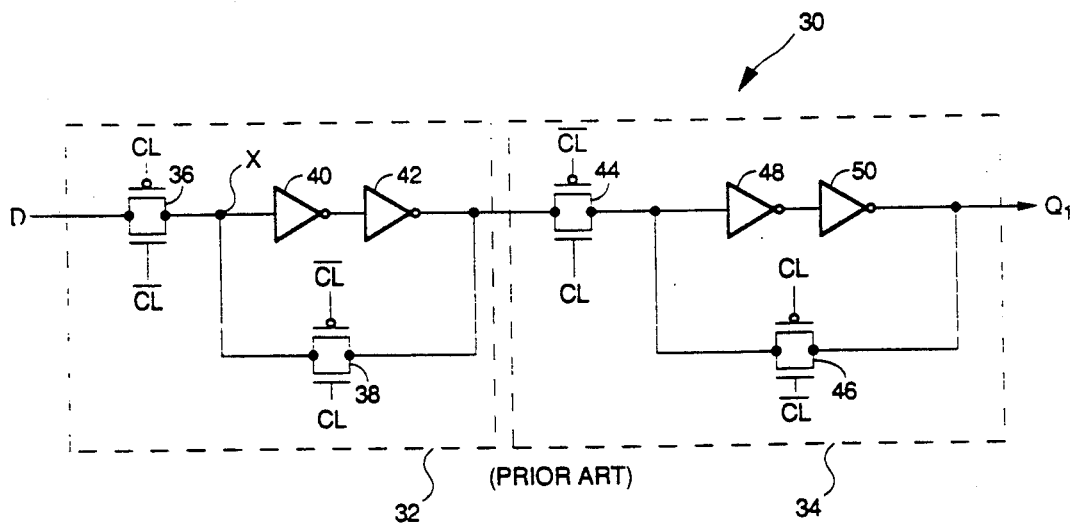
FIG. 2 is a schematic diagram of a prior art storage element.

FIG. 2 depicts a conventional latch storage element 30. Such a storage element 30 typically is embodied as part of a multiplier, adder, control circuit or other arithmetic, logic or control device. The element 30 as shown is a master-slave D-latch type of storage element which receives and stores a data signal D which may be read at an output Q. The element 30 includes two stages (e.g., latches) 32, 34. The first stage 32 includes two transmission gates 36, 38 and two logic gates 40, 42. The second stage 34 is the same as the first, including two transmission gates 44, 46 and two logic gates 48, 50. Each of the transmission gates 36, 38, 44, 46 is formed by a pair of CMOS transistors of opposite polarity coupled together at respective sources and drains. The respective gates receive an inverted clock input signal CL bar and a non-inverted clock input signal CL. Typically, gates 36 and 46 are in a common on/off state, while transmission gates 38 and 44 are in another common on/off state, opposite from the state of gates 36, 46.

For a typical operation, a data signal D is input to transmission gate 36. When the clock signal CL is low, transmission gate 36 is on, while transmission gates 38 and 44 are off. As a result, the data signal D is conducted through logic gates 40, 42 to the input of transmission gate 44. Because transmission gate 44 is in an off state, the signal D is not immediately passed through gate 44 to the logic gates 48, 50 and the output line Q. Thus, when the clock signal CL is low the input signal D is received into the first stage 32 and stored in such first stage 32. At the same time, the prior storage contents remain stored in the second stage 34, available at the output Q and being fedback through transmission gate 46.

Thereafter, when the clock signal CL undergoes a transition to a high signal level, the transmission gates 36 and 46 turn off, while the transmission gates 38 and 44 turn on. As a result, the data signal D at the input of gate 44 is transmitted through the logic gates 48, 50 to the output Q. At the first stage 32, such data signal D circulates through the transmission gate 38 and logic gates 40, 42 to gate 44. Accordingly, when the clock signal goes high, the stored contents of the first stage 32 are fed to the second stage 34 where the contents are available to be read at the output Q.

Modified Storage Element

Figure 3:
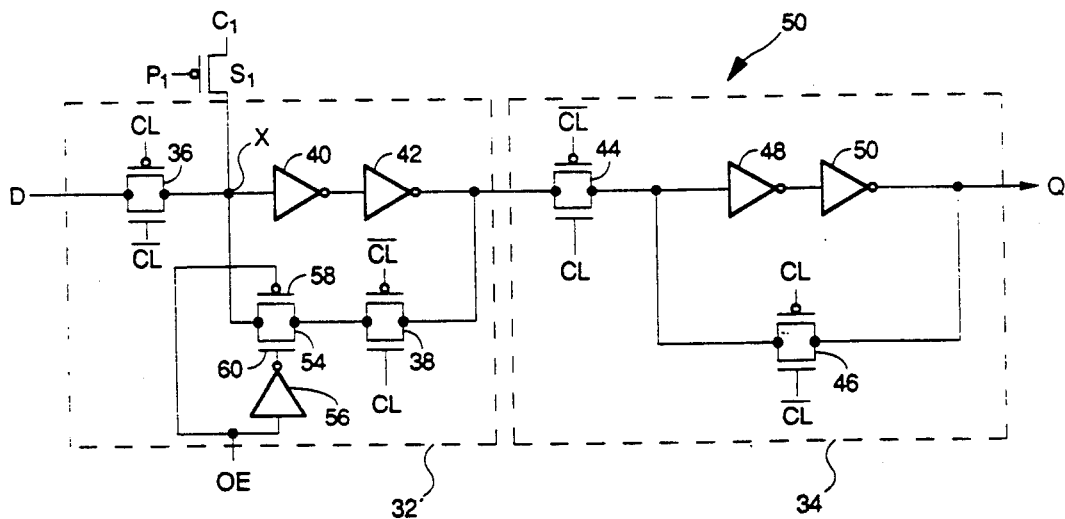
FIG. 3 is a schematic of a test apparatus interface and a storage element as modified according to an embodiment of this invention.

FIG. 3 shows a modified storage element 50 and test switch $S_1$. The modified storage element 50 includes a modified first stage 32' and second stage 34, including the transmission gates 36, 38, 44, 46 and logic gates 40, 42, 48, 50 as configured in the conventional storage element 30. In addition, however, the modified storage element 50 includes an additional transmission gate 54 and an inverter 56. The transmission gate 54 is formed from CMOS transistors 58, 60 of opposite polarity coupled together at the respective sources and drains. The coupled sources are electrically connected to a point X at which the data input D is received out of transmission gate 36. The coupled drains are electrically connected to the transmission gate 38. The gate terminals of the transistors 58, 60 receive the overwrite enable signal OE.

The added transmission gate 54 is depicted within the first stage 32 coupled to the point X which in turn is coupled to the switch $S_1$. The signal path from point X to the transmission gate 54 defines an internal transmission path to which a desired logic state from control/sense line $C_1$ is directly input.

According to another embodiment (not shown), the added transmission gate 54 alternatively may be within the second stage 34 at the same relative location (e.g., adjacent to the transmission gate 46). According to such alternative embodiment, the switch $S_1$ also would be alternatively positioned so as to be coupled to the second stage 34—at the output of transmission gate 44.

The switch $S_1$ is formed by a CMOS transistor with the probe line $P_1$ defining the on/off state of the switch $S_1$. A signal along probe line $P_1$ is received at a gate terminal and a signal along control/sense line $C_1$ is received at a source terminal. When the switch $S_1$ is on, the signal along control/sense line $C_1$ is conducted through the switch $S_1$ to point X within the storage element 50.

According to normal data writing and reading operations, the modified storage element 50 of FIG. 3 operates the same as the conventional storage element 30 with the overwrite enable signal OE being inactive. According to test overwriting and sensing operations, the modified storage element 50 operates as described below.

Overwriting and Sensing Test Operations

Figure 4:
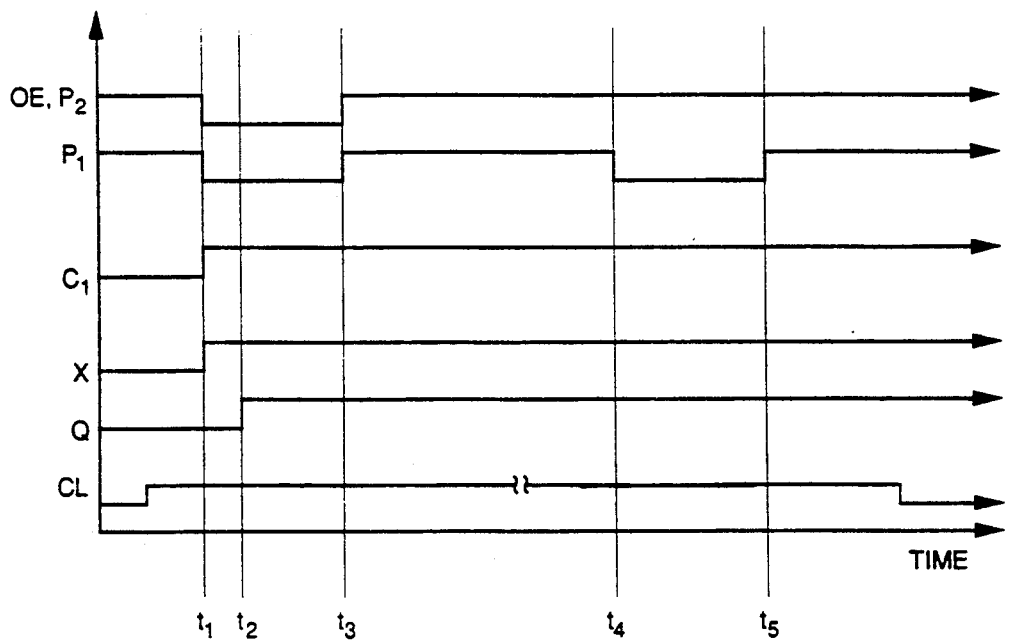
FIG. 4 is a timing diagram illustrating a desired logic state being forced upon the storage element of FIG. 3.

FIG. 4 is a timing diagram of pertinent signals for an overwrite operation and a sense operation at the modified storage element 50. The overwrite operation, as depicted, occurs during the first pulse 62 (e.g., active-low pulse) of the probe line $P_1$, while the sense operation occurs during the second pulse 64 of the probe line $P_1$. With regard to the overwrite operation, the overwrite enable signal OE and probe line $P_1$ become active at time $t_1$. While both signals $P_1$ and OE are active, the logic level of the control/sense line $C_1$ is received at point X of the storage element 50. FIG. 4 depicts signal $C_1$ being at the desired logic state and transmitted to point X at time $t_1$. In practice, a small transmission delay may be present but is ignored for purposes of this description.

The logic state of control/sense line $C_1$ is the desired logic state to be stored at element 50. As depicted, the clock signal CL is high at the time signals OE and $P_1$ become active. Thus, gate 44 is on causing the received signal to be transmitted through gate 44 to the output Q.

When probe line $P_1$ and/or overwrite enable signal OE return to an inactive level at time t3, the received logic state of point X is maintained by the storage element 50 as the stored contents, thereby overwriting the prior contents.

The relative timing between the overwrite enable signal OE, probe line signal $P_1$ and control line signal $C_1$ is not critical. The logic level of control line $C_1$ during the clock signal CL high pulse immediately prior to the time the first of signals $P_1$ and OE switch to inactive determines the continuing stored contents overwritten into storage element 50.

With regard to the sensing operation, the stored contents of element 50 are sensed at point X by activating switch $S_1$ at time $t_4$, without activating the overwrite enable signal OE. As previously described, switch $S_1$ is activated by an active (e.g., low-going) transition of the probe line $P_1$. While switch $S_1$ is active, the control/sense line $C_1$ may be monitored to sense the signal level of point X. The sense operation is terminated at time $t_5$, when the probe line $P_1$ returns to the inactive state (e.g., high).

Apparatus For Setting Desired Logic State

Figure 5:
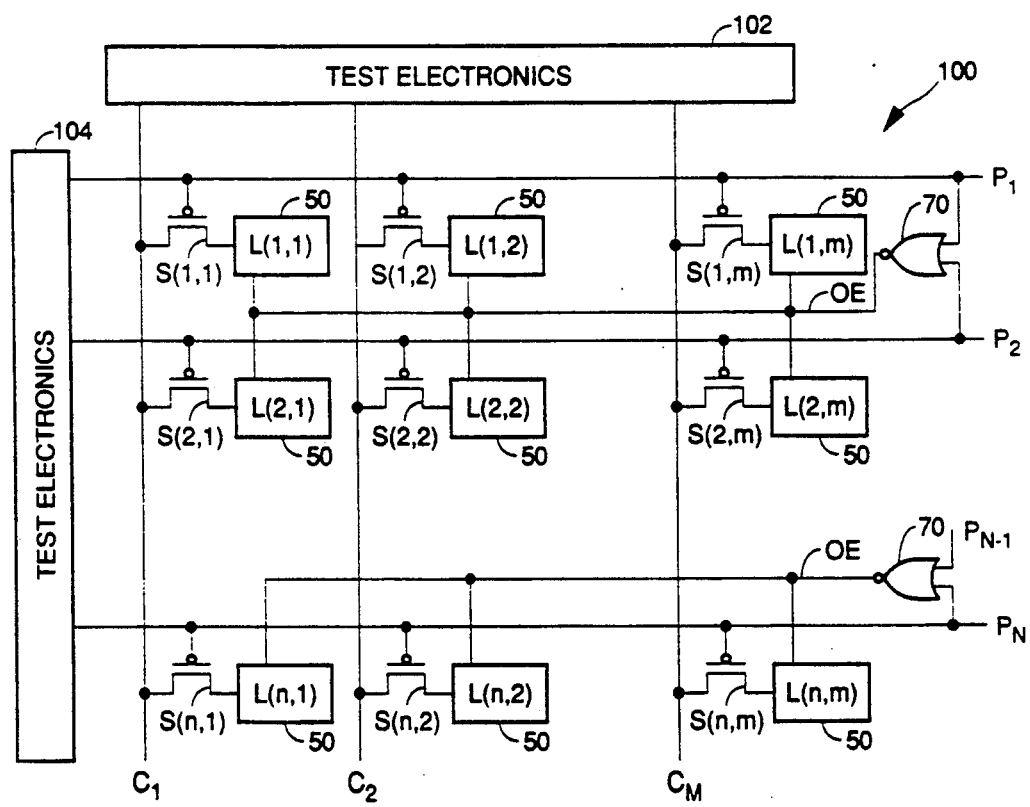
FIG. 5 is a block diagram of an integrated circuit having a plurality of storage elements and test electronics for forcing a desired logic state on select ones of such storage elements.

FIG. 5 depicts an array 100 of modified storage elements 50 embodied in a common integrated circuit (IC), along with a test grid structure including a plurality of intersecting probe lines $P_1$ to $P_N$ and control/sense lines $C_1$ to $C_M$. At each intersection a switch $S(n,m)$ is included, which is configured the same as the switch $S_1$ of FIG. 3. As depicted the storage elements 50 form an array of rows and columns in which an individual storage element is referred to by its array location (e.g., $L(n,m)$).

With regard to each switch $S(n,m)$, a probe line $P_n$ is received at a gate terminal to define the switch on/off state and a control/sense line $C_m$ is coupled to a source terminal for carrying the desired logic state to a corresponding storage element 50 when the switch is in an on state. The control/sense line $C_m$ in addition may perform to sense the stored logic state of a storage element 50. The drain terminal of each switch is coupled to an internal point X of a storage element 50, as previously described.

Test electronics 102 and 104 are coupled to the grid structure for defining the signals along probe line $P_1-P_N$ and control/sense line $C_1-C_M$. Such test electronics 102, 104 may be located on the IC chip or be coupled to such IC chip. The test electronic 102, 104 provide individual control over each probe line $P_n$ and control/sense line $C_m$. Accordingly, rows or columns of the array 100 may be addressed to perform an overwrite or sense operation upon select storage elements 50.

Overwrite Enable Signal Source

As described above, the overwrite enable signal OE turns off an added transmission gate 54 (FIG. 3) of the storage element 50 to enable a desired logic state at a control/sense line $C_m$ to overwrite the current storage contents. The overwrite enable signal OE may be defined uniquely or in common for each storage element 50 on an IC. To define the signal OE uniquely, however, would require a separate line for each storage element, thereby using expensive silicon space on the IC. Such an approach also would involve independent control of each overwrite enable signal. To define the signal OE in common would require less silicon space and a common control scheme. A common overwrite enable signal, however, still would require routing the signal line to each storage element using up significant silicon area. Thus, according to a preferred embodiment of the invention, the overwrite enable signal for a given storage element 50 is determined by one or more probe lines $P_n$.

According to the above-described test grid structure, multiple probe lines and control/sense lines form intersections at which a switch S(n,m) is located for coupling the control/sense line $C_m$ to a test access point X of a storage element 50. Accordingly, multiple probe lines are embodied in the silicon area near a storage element 50. As shown in the timing diagram of FIG. 4, there is a relation between the probe line $P_1$ for selecting the storage element 50 and the overwrite enable signal OE. Although, the timing of the two signals OE and $P_1$ need not be substantially simultaneous, such timing may be substantially simultaneous for an overwrite operation. Thus, the probe line $P_1$ of a storage element 50 may be used, in part, to define the overwrite enable signal OE of the same element 50.

Figure 6:
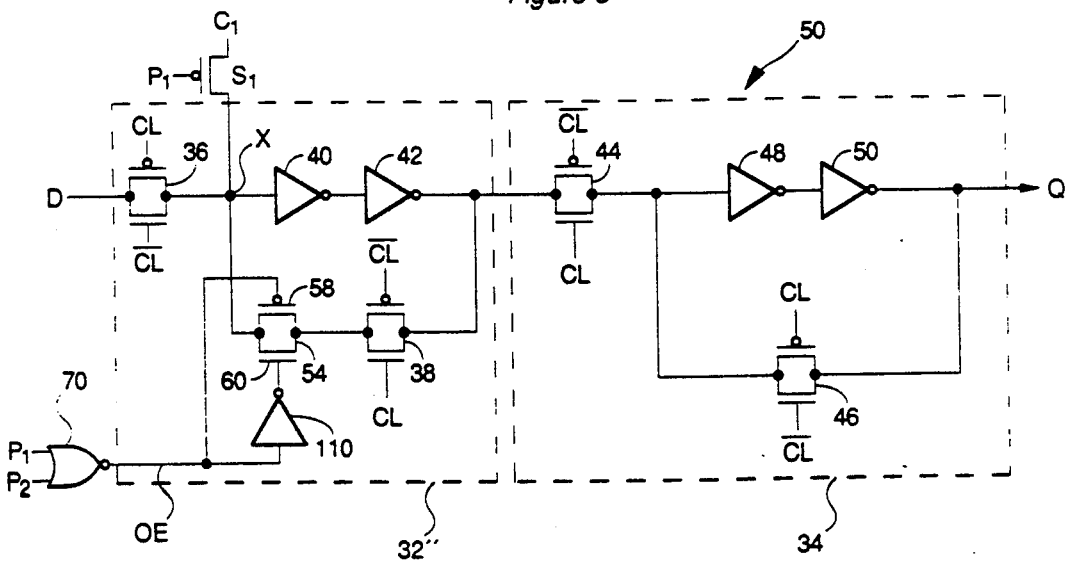
FIG. 6 is an alternative embodiment for the modified storage element of FIG. 3.

FIG. 5 shows an embodiment in which a NOR gate 70 is coupled to multiple probe lines which define the overwrite enable signal OE. The storage element 50 for such an embodiment is shown in FIG. 6. As shown, the overwrite enable signal OE is formed by the logical NOR operation of the probe lines $P_1$ and $P_2$. For the storage element 50 of FIG. 6, the logic state of probe line $P_2$ defines the override enable signal OE while probe line $P_1$ is active.

FIG. 4 shows the timing diagram for the overwrite and the sense operations for such an embodiment in which the overwrite enable signal OE is defined by the logical NOR of $P_1$ and $P_2$. Such overwrite and sense operations occur the same as for the previous description of FIG. 4. As shown, the overwrite enable signal follows the probe line $P_2$ when probe line $P_1$ is active. Thus, an overwrite occurs when both probe lines $P_1$ and $P_2$ are active, while a sense operation occurs when only probe line $P_1$ is active.

Referring to FIG. 5, the NOR gates 70 are shown, respectively, receiving two probe lines. One NOR gate 70 receives probe lines $P_1$ and $P_2$. Rows 1 and 2 of the array 100 (e.g., L(1,1) to L(1,N) and L(2,1) to L(2,n)) receive the output of the NOR gate 70. For row 1, the timing diagram of FIG. 4 is accurate as it appears. For row 2, the labels for $P_1$ and $P_2$ are reversed. Accordingly, for row 1 the overwrite enable signal follows the probe line $P_2$ when probe line $P_1$ is active. An overwrite occurs for row 1 storage elements when both probe lines $P_1$ and $P_2$ are active, while a sense operation occurs when only probe line $P_1$ is active. Conversely, for row 2 the overwrite enable signal follows the probe line $P_1$ when probe line $P_2$ is active. Thus, an overwrite occurs for row 2 storage elements when both probe lines $P_1$ and $P_2$ are active, while a sense operation occurs when only probe line $P_2$ is active. Additionally, NOR gate 70 may be incorporated into element 50 to generate signal OE within each element L(1,1) to L(n,m).

Accordingly, by defining the overwrite enable signal from the probe lines near a given storage element, an effective use of silicon area is achieved.

Figure 7:
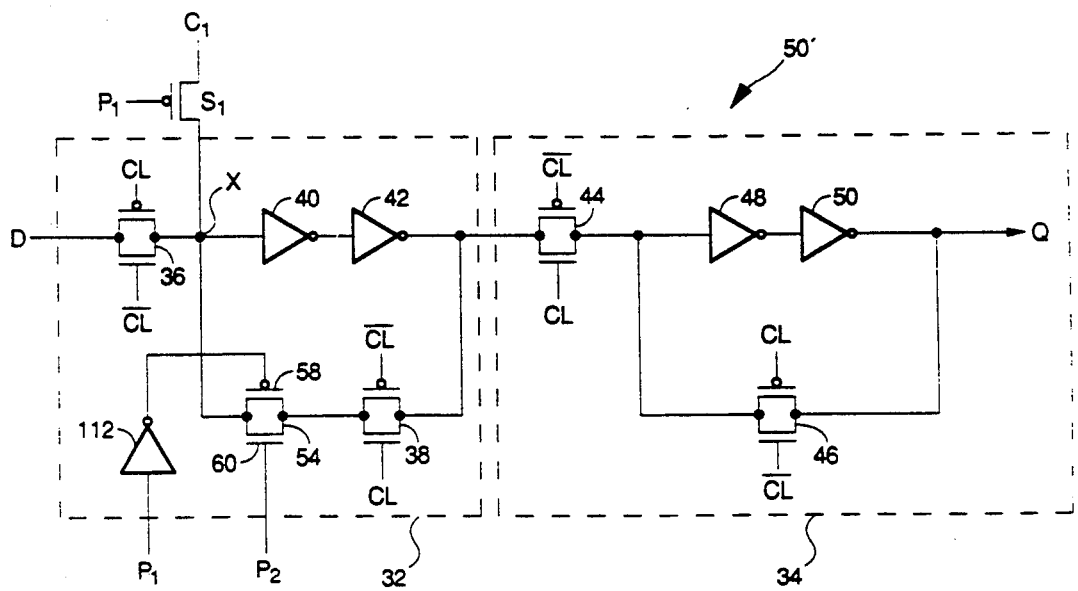
FIG. 7 is another alternative embodiment for the modified storage element of FIG. 3.
Figure 8:
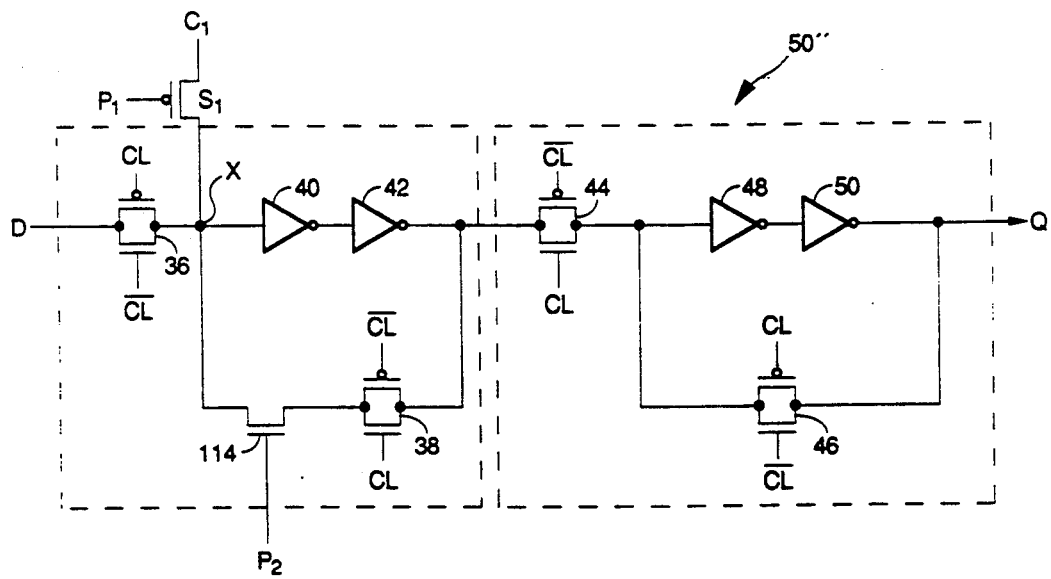
FIG. 8 is another alternative embodiment for the modified storage element of FIG. 3.

Further optimization of silicon is achieved according to the storage element embodiments shown in FIGS. 7 and 8. FIG. 7 shows a storage element 50' similar to the storage element 50 of FIG. 3 with the inverting and non-inverting inputs to the transmission gate 54 being generated separately, rather than from a common signal. According to the FIG. 7 embodiment, probe line $P_2$ forms the overwrite enable signal. Such signal $P_2$ when active will turn off the transmission gate 54 when probe line $P_1$ is active. Accordingly, the timing for respective overwrite and sense operations is the same as previously described with regard to FIG. 4.

According to the FIG. 8 embodiment, the modified storage element 50'' includes a single CMOS transistor 114 in place of the transmission gate 54. Probe line $P_2$ is received at the gate of transistor 114. Such signal $P_2$ forms the overwrite enable signal OE. According to this embodiment, the test circuitry 104 controls $P_1$ and $P_2$ to conform to the timing diagram of FIG. 4. Thus, when both $P_1$ and $P_2$ are active an overwrite operation occurs. When only $P_1$ is active a sense operation occurs.

CONCLUSION

Although a preferred embodiment of the invention has been illustrated and described, the invention may include alternative embodiments and changes. For example, although a crosscheck matrix structure is described for the integrated circuit, the invention is applicable to other types of matrices and other technologies with the appropriate substitutions. Further, although a two stage master-slave D-latch is depicted as the storage element 50, a single stage of other type of storage element may be used. Accordingly, the scope of the invention is not intended to be limited, except by the claims.

What is claimed is:

1. A method for overwriting storage contents of a storage element in an integrated circuit, said storage element having an input for receiving logic signals, by writing a desired logic state to a internal transmission path of the storage element, the method comprising the steps of:
    enabling said internal transmission path with a test signal; and
    inputting separately from said input a desired logic state to said storage element directly to said internal transmission path while said internal transmission path is enabled, thereby overwriting the contents of said storage element with said desired logic state.

2. The method of claim 1, wherein the step of enabling comprises turning on a first switch coupled to said internal transmission path with said test signal, and wherein the step of inputting comprises the steps of selecting said storage element by turning on a second switch coupled to said storage element and conducting through said second switch said desired logic state, said second switch being directly coupled to said internal transmission path of said storage element; and further comprising the step of deselecting said storage element by turning off said second switch after said step of inputting has terminated.

3. A method for overwriting the contents of a first storage element among a plurality of storage elements including said first storage element and a second storage element, said first storage element selectable with a first probe signal, said second storage element selectable with a second probe signal, the method comprising the steps of:
    selecting said first storage element by activating said first probe signal;
    enabling an internal transmission path of said first storage element by activating said first and second probe signals;
    inputting a desired logic state to said internal transmission path while said first storage element is selected and while said internal transmission path is enabled;
    thereby overwriting the contents of said first storage element with said desired logic state.

4. An apparatus for setting a desired logic state at a first storage element of a plurality of storage elements including said first storage element and a second storage element, said first storage element selectable for receiving said desired logic state with a first probe signal, said second storage element selectable with a second probe signal, the apparatus comprising:

means for selecting said first storage element to receive said desired logic state, said selecting means being directly coupled to an internal transmission path of said first storage element for passing said desired logic state to said internal transmission path when said selecting means is activated by said first probe signal;

means for enabling said internal transmission path of said first storage element in response to an overwrite enable signal; and means for inputting said desired logic state to said internal transmission path while said first storage element is selected and while said internal transmission path is enabled.

5. The apparatus of claim 4, further comprising means for generating said overwrite enable signal from said first and second probe signals.

6. The apparatus of claim 5, in which said generating means comprises a NOR gate.

7. The apparatus of claim 4, in which said overwrite enable signal comprises said second probe signal.

8. The apparatus of claim 4, in which said enabling means comprises a pair of CMOS transistors of opposite polarity coupled together at respective sources and drains.

9. The apparatus of claim 8, in which one of said pair of CMOS transistors receives at a gate terminal a non-inverted overwrite enable signal and the other of said pair of CMOS transistors receives at a gate terminal an inverted overwrite enable signal.

10. The apparatus of claim 8, in which a gate terminal of one of said pair of CMOS transistors is coupled to said first probe signal and in which a gate of the other of said pair of CMOS transistors is coupled to said second probe signal.

11. The apparatus of claim 4, in which said enabling means comprises a CMOS transistor having respective on/off states defined by said second probe signal.

* * * * *